United States Patent
Kim et al.

(10) Patent No.: US 10,535,829 B1
(45) Date of Patent: Jan. 14, 2020

(54) QUANTUM DOT DEVICE AND DISPLAY DEVICE

(71) Applicant: SAMSUNG ELECTRONICS CO., LTD., Suwon-si, Gyeonggi-do (KR)

(72) Inventors: Chan Su Kim, Seoul (KR); Tae Ho Kim, Suwon-si (KR); Kun Su Park, Seongnam-si (KR); Sung Woo Kim, Hwaseong-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/203,666

(22) Filed: Nov. 29, 2018

(30) Foreign Application Priority Data

Jul. 24, 2018 (KR) .................. 10-2018-0085986

(51) Int. Cl.
| | | |
|---|---|---|
| *H01L 51/50* | (2006.01) | |
| *C09K 11/88* | (2006.01) | |
| *H01L 51/00* | (2006.01) | |
| *B82Y 40/00* | (2011.01) | |
| *B82Y 20/00* | (2011.01) | |

(52) U.S. Cl.
CPC .......... *H01L 51/502* (2013.01); *C09K 11/883* (2013.01); *H01L 51/0037* (2013.01); *H01L 51/0039* (2013.01); *B82Y 20/00* (2013.01); *B82Y 40/00* (2013.01); *H01L 2251/552* (2013.01)

(58) Field of Classification Search
CPC ............... H01L 51/502; H01L 51/0037; H01L 51/0039; C09K 11/883
See application file for complete search history.

(56) References Cited

U.S. PATENT DOCUMENTS

| | | | | |
|---|---|---|---|---|
| 9,073,752 | B2 * | 7/2015 | Kang | B82Y 20/00 |
| 9,793,505 | B2 * | 10/2017 | Zhou | B82Y 20/00 |
| 10,003,037 | B2 * | 6/2018 | Luchinger | H01L 51/4246 |
| 2015/0000744 | A1 * | 1/2015 | Park | H01L 51/0037 |
| | | | | 136/263 |
| 2017/0028389 | A1 * | 2/2017 | Kim | B01J 31/06 |

(Continued)

FOREIGN PATENT DOCUMENTS

| | | |
|---|---|---|
| KR | 20110127897 A | 11/2011 |
| KR | 1560088 B1 | 10/2015 |

(Continued)

OTHER PUBLICATIONS

Jongmin Choi et al., "Chloride Passivation of ZnO Electrodes Improves Charge Extraction in Colloidal Quantum Dot Photovoltaics", Advanced Materials, Jul. 3, 2017, pp. 1-5, vol. 1702350.

*Primary Examiner* — Earl N Taylor
(74) *Attorney, Agent, or Firm* — Cantor Colburn LLP

(57) ABSTRACT

A quantum dot device including an anode and a cathode facing each other, a quantum dot layer between the anode and the cathode and electron auxiliary layer between the quantum dot layer and the cathode, wherein the electron auxiliary layer includes at least one nanoparticle represented by Chemical Formula 1 and at least one metal halide represented by Chemical Formula 2, and a display device.

$Zn_{1-x}M_xO$  Chemical Formula 1

$Q^+X^-$  Chemical Formula 2

20 Claims, 4 Drawing Sheets

(56) References Cited

U.S. PATENT DOCUMENTS

| | | | |
|---|---|---|---|
| 2017/0121598 A1* | 5/2017 | Min | C09K 11/88 |
| 2017/0186922 A1* | 6/2017 | Kim | C09K 11/703 |
| 2017/0342316 A1* | 11/2017 | Luther | H01L 51/005 |
| 2018/0013088 A1 | 1/2018 | Zhou et al. | |
| 2018/0044586 A1* | 2/2018 | Kwon, II | H01L 33/34 |
| 2018/0113350 A1* | 4/2018 | Jee | C08G 73/14 |
| 2018/0148638 A1* | 5/2018 | Ahn | H05B 33/14 |
| 2018/0151817 A1* | 5/2018 | Cho | H05B 33/14 |
| 2018/0179441 A1* | 6/2018 | Park | C09K 11/883 |
| 2018/0248052 A1* | 8/2018 | Seok | H01L 51/0003 |
| 2018/0261796 A1* | 9/2018 | Jang | C09K 11/06 |
| 2019/0119569 A1* | 4/2019 | Lee | C09K 11/883 |
| 2019/0136126 A1* | 5/2019 | Yang | G03F 7/322 |
| 2019/0157596 A1* | 5/2019 | Kim | H01L 51/5092 |
| 2019/0169500 A1* | 6/2019 | Kim | C09K 11/883 |
| 2019/0189928 A1* | 6/2019 | Chung | H01L 51/0007 |
| 2019/0189945 A1* | 6/2019 | Chung | H01L 51/502 |
| 2019/0211262 A1* | 7/2019 | Park | C09K 11/02 |

FOREIGN PATENT DOCUMENTS

| | | | |
|---|---|---|---|
| KR | 1620870 B1 | 5/2016 | |
| KR | 1695442 B1 | 1/2017 | |
| KR | 1772437 B1 | 8/2017 | |
| KR | 20170117466 A | 10/2017 | |
| KR | 20170121271 A | 11/2017 | |

\* cited by examiner

QUANTUM DOT DEVICE AND DISPLAY DEVICE

CROSS-REFERENCE TO RELATED APPLICATION

This application claims priority to and the benefit of Korean Patent Application No. 10-2018-0085986 filed in the Korean Intellectual Property Office on Jul. 24, 2018, and all the benefits accruing therefrom under 35 U.S.C. § 119, the entire contents of which are incorporated herein by reference.

BACKGROUND

1. Field

A quantum dot device and a display device are disclosed.

2. Description of the Related Art

Physical characteristics (e.g., energy bandgaps, melting points, etc.) of nanoparticles that are intrinsic characteristics may be controlled by changing the particle sizes of the nanoparticles, unlike bulk materials. For example, semiconductor nanocrystal particles, also known as quantum dots, are supplied with photoenergy or electrical energy and may emit light in a wavelength corresponding to sizes of the quantum dots. Accordingly, the quantum dots may be used as a light emitting element emitting light of a particular wavelength.

SUMMARY

A quantum dot device may use quantum dots as a light emitting element. However, the quantum dots are different from a conventional light emitting element, and a method of improving performance of the quantum dot device is desired.

An embodiment is to provide a quantum dot device capable of realizing improved performance.

An embodiment provides an electronic device including the quantum dot device.

According to an embodiment, a quantum dot device includes an anode and a cathode facing each other, a quantum dot layer between the anode and the cathode, and an electron auxiliary layer between the quantum dot layer and the cathode, wherein the electron auxiliary layer includes at least one nanoparticle represented by Chemical Formula 1 and at least one metal halide represented by Chemical Formula 2.

$$Zn_{1-x}M_xO \qquad \text{Chemical Formula 1}$$

In Chemical Formula 1,

M is Mg, Co, Ni, Zr, Mn, Sn, Y, Al, or a combination thereof, and $0 \leq x < 0.5$, $$Q^+X^- \qquad \text{Chemical Formula 2}$$

wherein, in Chemical Formula 2,

Q is Zn, Na, K, Li, or a combination thereof, and

X is a halogen.

The metal halide may be present between the nanoparticles.

The nanoparticle may be passivated by the metal halide.

The metal halide may be bound to the surface of the nanoparticle.

The nanoparticle may have an average particle diameter of less than or equal to about 10 nanometers (nm).

The metal halide may be present in an amount of about 3 to about 20 parts by weight relative to 100 parts by weight of the nanoparticle.

The nanoparticle may include a ligand bound to a surface of the nanoparticle.

The ligand may include an acetate, a carboxylate, a cyano group, an amine, an amide, a nitride, a nitrate, a sulfonyl, or a combination thereof.

The metal halide may be bound to the ligand.

A difference between lowest unoccupied molecular orbital (LUMO) energy levels of the quantum dot layer and the electron auxiliary layer may be greater than a difference between LUMO energy levels of the quantum dot layer and a layer including the nanoparticle.

A LUMO energy level of the quantum dot layer may range from about 2.5 electron volts (eV) to about 3.6 eV and a LUMO energy level of the electron auxiliary layer may range from about 3.7 eV to about 5.3 eV.

The nanoparticle and the metal halide may be present as a mixture.

The quantum dot layer may include a non-cadmium quantum dot.

The quantum dot may include zinc (Zn) and tellurium (Te) selenium (Se), or a combination thereof, or indium (In) and zinc (Zn), phosphorus (P), or a combination thereof.

The quantum dot may include a core including zinc (Zn) and tellurium (Te), selenium (Se), or a combination thereof or indium (In) and zinc (Zn), phosphorus (P), or a combination thereof and a shell disposed on at least a part of the core, the shell having a different composition from the core.

The shell may include ZnSeS, ZnS, or a combination thereof.

According to an embodiment, a method of manufacturing a quantum dot device includes forming an anode, forming a quantum dot layer on the anode, forming an electron auxiliary layer on the quantum dot layer, and forming a cathode on the electron auxiliary layer, wherein the forming of the electron auxiliary layer includes mixing a Zn precursor and optionally a precursor comprising M (wherein M is Mg, Co, Ni, Zr, Mn, Sn, Y, Al, or a combination thereof) in a first solvent to prepare a first solution, preparing a second solution including a nanoparticle represented by $Zn_{1-x}M_xO$ (wherein $0 \leq x < 0.5$) through a sol-gel reaction of the first solution, dissolving a metal halide represented by $Q^+X^-$ (wherein Q is Zn, Na, K, Li, or a combination thereof and X is a halogen) in a second solvent to prepare a third solution, preparing a mixed solution of the second solution and the third solution, and coating the mixed solution on the quantum dot layer.

The first solvent and the second solvent may include the same or different alcohols.

The metal halide in the mixed solution may be present in an amount of about 3 to about 20 parts by weight relative to 100 parts by weight of the nanoparticle.

According to an embodiment, a display device includes the quantum dot device.

Performance of the quantum dot device may be improved.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

Hereinafter, a quantum dot device according to an embodiment is described with reference to drawings.

Figure 1:
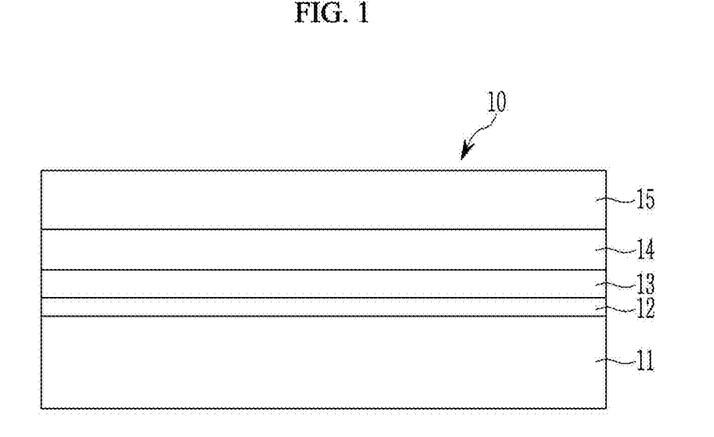
FIG. 1 is a schematic cross-sectional view of a quantum dot device according to an embodiment.

FIG. 1 is a schematic cross-sectional view of a quantum dot device according to an embodiment.

Referring to FIG. 1, a quantum dot device 10 according to an embodiment includes a first electrode 11 and a second electrode 15 facing each other, a quantum dot layer 13 disposed between the first electrode 11 and the second electrode 15, a hole auxiliary layer 12 disposed between the first electrode 11 and the quantum dot layer 13, and an electron auxiliary layer 14 disposed between the quantum dot layer 13 and the second electrode 15.

A substrate may be disposed at the side of the first electrode 11 or the second electrode 15. The substrate may be for example made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer. The substrate may be omitted.

One of the first electrode 11 and the second electrode 15 is an anode and the other is a cathode. For example, the first electrode 11 may be an anode and the second electrode 15 may be a cathode.

The first electrode 11 may be made of a conductor having high work function, and may be for example made of a metal, a conductive metal oxide, or a combination thereof. The first electrode 11 may be for example made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or $SnO_2$ and Sb, but is not limited thereto.

The second electrode 15 may be for example made of a conductor having a lower work function than the first electrode 11, and may be for example made of a metal, a conductive metal oxide, a conductive polymer, or a combination thereof. The second electrode 15 may be for example a metal or an alloy thereof such as aluminum, magnesium, calcium, sodium, potassium, titanium, indium, yttrium, lithium, gadolinium silver, tin, lead, cesium, barium, and the like; a multi-layer structure material such as LiF/Al, LiO$_2$/Al, Liq/Al, LiF/Ca, and BaF$_2$/Ca, but is not limited thereto.

A work function of the first electrode 11 may be higher than that of the second electrode 15. For example, the work function of the first electrode 11 may be for example about 4.5 eV to about 5.0 eV and the work function of the second electrode 15 may be for example greater than or equal to about 4.0 eV and less than about 4.5 eV. Within the ranges, the work function of the first electrode 11 may be for example about 4.6 eV to about 4.9 eV and the work function of the second electrode 15 may be for example about 4.0 eV to about 4.3 eV.

The first electrode 11, the second electrode 15, or a combination thereof may be a light-transmitting electrode and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, it may be made of for example an opaque conductor such as aluminum (Al), silver (Ag), or gold (Au).

The quantum dot layer 13 includes a quantum dot. The quantum dot may be a semiconductor nanocrystal, and may have various shapes, for example an isotropic semiconductor nanocrystal, a quantum rod, and a quantum plate. Herein, the quantum rod may indicate a quantum dot having an aspect ratio of greater than about 1:1, for example an aspect ratio of greater than or equal to about 2:1, greater than or equal to about 3:1, or greater than or equal to about 5:1. For example, the quantum rod may have an aspect ratio of less than or equal to about 50:1, of less than or equal to about 30:1, or of less than or equal to about 20:1.

The quantum dot may have for example a particle diameter (an average largest particle diameter for a non-spherical shape) of for example about 1 nm to about 100 nm, about 1 nm to about 80 nm, about 1 nm to about 50 nm, or about 1 nm to about 20 nm.

Energy bandgaps of quantum dots may be controlled according to sizes and compositions of the quantum dots, and thus photoluminescence wavelength may be controlled. For example, as the sizes of quantum dots increase, the quantum dots may have narrow energy bandgaps and thus emit light in a relatively long wavelength region while as the sizes of the quantum dots decrease, the quantum dots may have wide energy bandgap and thus emit light in a relatively short wavelength region.

For example, the quantum dot may emit for example light in a predetermined wavelength region of a visible ray region according to its size composition, or a combination thereof. For example, the quantum dot may emit blue light, red light, or green light, and the blue light may have for example a peak emission wavelength in about 430 nm to about 470 nm, the red light may have for example a peak emission wavelength in about 600 nm to about 650 nm, and the green light may have for example a peak emission wavelength in about 520 nm to about 550 nm. For example, the quantum dot may emit blue light having a peak emission wavelength in a wavelength of about 430 nm to about 470 nm.

For example, an average size of the blue light emitting quantum dot may be for example less than or equal to about 4.5 nm, less than or equal to about 4.3 nm, less than or equal to about 4.2 nm, less than or equal to about 4.1 nm, or less than or equal to 4.0 nm. Within the ranges, it may be for example about 2.0 nm to about 4.5 nm, about 2.0 nm to about 4.3 nm, about 2.0 nm to about 4.2 nm, about 2.0 about nm to about 4.1 nm, or about 2.0 nm to about 4.0 nm.

The quantum dot may have for example a quantum yield of greater than or equal to about 10%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM). Herein, the FWHM a width of a wavelength corresponding to a half of a peak absorption point and as the FWHM is narrower, light in a narrower wavelength region may be emitted and high color purity may be obtained. The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

For example, the quantum dot may be for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be for example a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto. The Group III-V semiconductor compound may be for example a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; or a quaternary element compound of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. The Group IV-VI semiconductor compound may be for example a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof, but is not limited thereto. The Group IV semiconductor compound may be for example a singular element semiconductor compound of Si, Ge, or a combination thereof; and a binary element semiconductor compound of SiC, SiGe, or a combination thereof, but is not limited thereto. The Group I-III-VI semiconductor compound may be for example of CuInSe$_2$, CuInS$_2$, CuInGaSe, CuInGaS, or a combination thereof, but is not limited thereto. The Group I-II-IV-VI semiconductor compound may be for example of CuZnSnSe and CuZnSnS, but is not limited thereto. The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or partially different concentration distributions.

For example, the quantum dot may include a non-cadmium-based quantum dot. Cadmium (Cd) may cause severe environment/health problems and a restricted element by Restriction of Hazardous Substances Directive (RoHS) in a plurality of countries, and thus the non-cadmium-based quantum dot may be effectively used.

For example, the quantum dot may be a semiconductor compound including zinc (Zn) and tellurium (Te), selenium (Se), or a combination thereof. For example, the quantum dot may be a Zn—Te semiconductor compound, a Zn—Se semiconductor compound, a Zn—Te—Se semiconductor compound, or a combination thereof. For example, in the Zn—Te—Se semiconductor compound, an amount of tellurium (Te) may be less than that of selenium (Se). The semiconductor compound may emit blue light having a peak emission wavelength in a wavelength region of less than or equal to about 470 nm, for example in a wavelength region of about 430 nm to about 470 nm.

For example, the quantum dot may be for example a semiconductor compound including indium (In) and zinc (Zn), phosphorus (P), or a combination thereof. For example, the quantum dot may be an In—Zn semiconductor compound, an In—P semiconductor compound, an In—Zn—P semiconductor compound, or a combination thereof. For example, in the In—Zn semiconductor compound or the In—Zn—P semiconductor compound, a mole ratio of zinc (Zn) relative to indium (In) may be greater than or equal to about 25:1. The semiconductor compound may emit blue light having a peak emission wavelength in a wavelength region of less than or equal to about 470 nm, for example in a wavelength region of about 430 nm to about 470 nm.

The quantum dot may have a core-shell structure wherein a shell surrounds a core. For example, the core and the shell of the quantum dot may have an interface, and an element of at least one of the core or the shell in the interface may have a concentration gradient wherein the concentration of the element(s) of the shell decreases toward the core. For example, a material composition of the shell of the quantum dot has a higher energy bandgap than a material composition of the core of the quantum dot, and thereby the quantum dot may exhibit a quantum confinement effect.

The quantum dot may have one quantum dot core and a multi-layered quantum dot shell surrounding the core. Herein, the multi-layered shell has at least two shells wherein each shell independently may be a single composition, an alloy, or have a concentration gradient.

For example, a shell of a multi-layered shell that is farther from the core may have a higher energy bandgap than a shell that is closer to the core, and thereby the quantum dot may exhibit a quantum confinement effect.

For example, the quantum dot having a core-shell structure may for example include a core including a first semiconductor compound including zinc (Zn) and tellurium (Te), selenium (Se), or a combination thereof and a shell disposed on at least a part of the core and including a second semiconductor compound having a different composition from that of the core.

A Zn—Te—Se-based first semiconductor compound may be for example a Zn—Se-based semiconductor compound including a relatively small amount of tellurium (Te) and, for example, a semiconductor compound represented by ZnTe$_x$Se$_{1-x}$ (wherein, x is greater than about 0 and less than or equal to about 0.05).

For example, in the Zn—Te—Se-based first semiconductor compound, the mole amount of zinc (Zn) may be greater than that of selenium (Se), and the mole amount of selenium (Se) may be greater than that of tellurium (Te). For example, in the first semiconductor compound, a mole ratio of tellurium (Te) relative to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.02:19, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) relative to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.010:1.

The second semiconductor compound may include for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above.

For example, the second semiconductor compound may include zinc (Zn), selenium (Se), sulfur (S), or a combination thereof. For example, the shell may include at least one internal shell disposed close to the core and an outermost shell disposed as the outermost shell of the quantum dot and the internal shell may include ZnSeS and the outermost shell may include SnS. For example, the shell may have a concentration gradient of one component and for example an amount of sulfur (S) may increase in a direction away from the core.

For example, the quantum dot having a core-shell structure may include for example a core including a third semiconductor compound including indium (In) and zinc (Zn), phosphorus (P), or a combination thereof and a shell disposed on at least a part of the core and including a fourth semiconductor compound having a different composition from the core.

In the In—Zn—P-based third semiconductor compound, a mole ratio of zinc (Zn) relative to indium (In) may be greater than or equal to about 25:1. For example, in the In—Zn—P-based first semiconductor compound, the mole ratio of zinc (Zn) relative to indium (In) may be greater than or equal to about 28:1, greater than or equal to about 29:1, or greater than or equal to about 30:1. For example, in the In—Zn—P-based first semiconductor compound, the mole ratio of zinc (Zn) relative to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above.

For example, the fourth semiconductor compound may include zinc (Zn) and sulfur (S), and optionally selenium (Se). For example, the shell may include at least one internal shell disposed close to the core and an outermost shell disposed as the outermost shell of the quantum dot and the internal shell, the outermost shell, or a combination thereof may include the fourth semiconductor compound of ZnS or ZnSeS.

The quantum dot layer 13 may have for example a thickness of about 5 nm to about 200 nm, for example about 10 nm to about 150 nm, about 10 nm to about 100 nm, or about 10 nm to about 50 nm.

The quantum dot layer 13 may have a relatively high HOMO energy level and may be for example a HOMO energy level of greater than or equal to about 5.4 eV, greater than or equal to about 5.6 eV, greater than or equal to about 5.7 eV, greater than or equal to about 5.8 eV, greater than or equal to about 5.9 eV or greater than or equal to about 6.0 eV. The HOMO energy level of the quantum dot layer 13 may be for example about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV, within the ranges, for example about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, or about 5.6 eV to about 6.1 eV, for example about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, or about 5.7 eV to about 6.1 eV, for example about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, for example about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

The quantum dot layer 13 may have a relatively low LUMO energy level, and may have for example an LUMO energy level of less than or equal to about 3.6 eV, for example less than or equal to about 3.5 eV, less than or equal to about 3.4 eV, less than or equal to about 3.3 eV, less than or equal to about 3.2 eV, or less than or equal to about 3.0 eV. The LUMO energy level of the quantum dot layer 13 may be for example about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, or about 2.5 eV to about 3.0 eV.

The quantum dot layer 13 may have an energy bandgap of about 2.4 eV to about 2.9 eV. Within the ranges, it may have for example an energy bandgap of about 2.4 eV to about 2.8 eV, for example about 2.4 eV to about 2.78 eV.

The hole auxiliary layer 12 is disposed between the first electrode 11 and the quantum dot layer 13. The hole auxiliary layer 12 may have one layer or two or more layers, may for example help ease injection and/or transport of charges such as holes from the first electrode 11 into the quantum dot layer 13, and may include for example a hole injection layer, a hole transport layer, an electron blocking layer, or a combination thereof.

The hole auxiliary layer 12 may have a relatively high HOMO energy level so that it may match a HOMO energy level of the quantum dot layer 13. Accordingly, mobility of holes from the hole auxiliary layer 12 into the quantum dot layer 13 may be increased.

The hole auxiliary layer 12 may have the same HOMO energy level as the quantum dot layer 13 or a lower HOMO energy level than the quantum dot layer 13 within a difference of about 1.0 eV or less. For example, a difference between HOMO energy levels of the hole auxiliary layer 12 and the quantum dot layer 13 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The hole auxiliary layer 12 may have a HOMO energy level of for example greater than or equal to about 5.0 eV, greater than or equal to about 5.2 eV, greater than or equal to about 5.4 eV, greater than or equal to about 5.6 eV, or greater than or equal to about 5.8 eV.

For example, the hole auxiliary layer 12 may have a HOMO energy level of about 5.0 eV to about 7.0 eV, for example about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

For example, the hole auxiliary layer 12 may include a hole injection layer close to the first electrode 11 and a hole transport layer close to the quantum dot layer 13. Herein, the hole injection layer may have a HOMO energy level of about 5.0 eV to about 6.0 eV, about 5.0 eV to about 5.5 eV, or about 5.0 eV to about 5.4 eV, and the hole transport layer may have a HOMO energy level of about 5.2 eV to about 7.0 eV, for example about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

The hole auxiliary layer 12 may include a suitable material satisfying the energy level without any particular limit and may be for example poly(9,9-dioctyl-fluorene-co-N-(4-butylphenyl)-diphenylamine (TFB), polyarylamine, poly(N-vinylcarbazole, poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), (4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1-bis[(di-4-tolylamino)phenylcyclohexane (TAPC), a p-type metal oxide (e.g., NiO, WO$_3$, MoO$_3$, etc.), a carbon-based material such as graphene oxide, or a combination thereof, but is not limited thereto.

The electron auxiliary layer 14 is disposed between the quantum dot layer 13 and the second electrode 15. The electron auxiliary layer 14 may have one layer or two or more layers, and may for example help ease injection and/or transport of charges such as electrons from the second electrode 15 into the quantum dot layer 13, or may control mobility rates of charges such as electrons. The electron auxiliary layer 14 may include for example an electron injection layer, an electron transport layer, an electron controlling layer, a hole blocking layer, or a combination thereof, but is not limited thereto.

The electron auxiliary layer 14 includes at least one nanoparticle represented by Chemical Formula 1 and at least one metal halide represented by Chemical Formula 2.

$$Zn_{1-x}M_xO \quad \text{Chemical Formula 1}$$

In Chemical Formula 1,

M is Mg, Co, Ni, Zr, Mn, Sn, Y, Al, or a combination thereof, and

0≤x<0.5, $$Q^+X^- \quad \text{Chemical Formula 2}$$

wherein, in Chemical Formula 2,

Q is Zn, Na, K, Li, or a combination thereof, and

X is a halogen.

The nanoparticle represented by Chemical Formula 1 may be zinc oxide (ZnO) or zinc oxide on which a metal except, e.g., other than, zinc is doped.

For example, M of Chemical Formula 1 may be for example Mg, Co, Ni, or a combination thereof, but is not limited thereto.

For example, x of Chemical Formula 1 may satisfy for example 0.01≤x≤0.4, 0.02≤x≤0.4, 0.03≤x≤0.3, or 0.05≤x≤0.3, but is not limited thereto.

An average particle size of the nanoparticle may be for example less than or equal to about 10 nm.

For example, an average particle size of the zinc oxide may be for example about 3.0 nm to about 10.0 nm, for example about 3.5 nm to about 8.0 nm, about 3.5 nm to about 7.0 nm, about 3.5 nm to about 6.0 nm, about 3.5 nm to about 5.5 nm, about 3.5 nm to about 5.0 nm, about 4.0 nm to about 5.0 nm, or about 4.5 nm to about 5.0 nm.

For example, an average particle size of the metal-doped zinc oxide may be less than about 3.5 nm, for example less than or equal to about 3.4 nm, less than or equal to about 3.3 nm, less than or equal to about 3.2 nm, less than or equal to about 3.1 nm, or less than or equal to about 3.0 nm. An average particle size of a first nanoparticle may be for example greater than or equal to about 1.2 nm and less than about 3.5 nm, greater than or equal to about 1.3 nm and less than about 3.4 nm, about 1.5 nm to about 3.3 nm, about 1.8 nm to about 3.3 nm, or about 2.0 nm to about 3.3 nm.

For example, the electron auxiliary layer 14 may include zinc oxide.

For example, the electron auxiliary layer 14 may include metal (M)-doped zinc oxide.

For example, the electron auxiliary layer 14 may include a mixture of zinc oxide and metal (M)-doped zinc oxide.

The metal halide is an ionic compound including a cation of Na, K, Li, or a combination thereof and a halogen anion, i.e., a halide. The cation and anion of the metal halide may be separated or may be present together in the electron auxiliary layer 14. In the present specification, the metal halide may refer to a cation or an anion that are separated from each other as well as a cation and an anion that are present together.

The metal halide may be present between the nanoparticles and for example the metal halide may fill gaps between the nanoparticles.

For example, the nanoparticle may be surrounded by the metal halide and thus passivated.

For example, the metal halide may be bound to the surface of the nanoparticle.

For example, the nanoparticle may include a ligand bound to the surface, and the metal halide may be bound to the ligand. The ligand may include an acetate, a carboxylate, a cyano group, an amine, an amide, a nitride, a nitrate, a sulfonyl, or a combination thereof, but is not limited thereto.

The nanoparticle and metal halide have sufficient miscibility in a solvent, and as aforementioned, the metal halide surrounds and passivates the surface of the nanoparticle and thus may increase solution stability and dispersibility. Accordingly, even when the nanoparticle passivated with the metal halide is allowed to stand at room temperature or a high temperature for a long time, neither a precipitate nor agglomerate is not easily formed, and thus storage stability may be increased.

In addition, the metal halide fills gaps among the nanoparticles and thus may form the electron auxiliary layer 14 having a dense structure and accordingly, decrease leakage current and simultaneously, block holes from passing the quantum dot layer 13 and thus improve efficiency and life-span of a quantum dot device.

An amount of the metal halide may be controlled according to characteristics desired for the electron auxiliary layer 14, and may be for example about 3 to about 20 parts by weight, based on 100 parts by weight of the nanoparticle. Within the range, solution stability and dispersibility, and electrical characteristics may be simultaneously improved. Within the ranges, it may be included in an amount of about 3 to about 15 parts by weight, about 3 to about 10 parts by weight, about 5 to about 10 parts by weight, or about 5 to about 8 parts by weight.

The electron auxiliary layer 14 may have a different energy level from a layer including, e.g., consisting of, zinc oxide and not including a metal halide (hereinafter, referred to as 'a zinc oxide layer') and/or a layer including, e.g., consisting of, metal (M)-doped zinc oxide and not including a metal halide (hereinafter, referred to as 'a metal-doped zinc oxide layer'). For example, a LUMO energy level of the electron auxiliary layer 14 may be different from a LUMO energy level of the zinc oxide layer or the metal-doped zinc oxide layer and for example the LUMO energy level of the electron auxiliary layer 14 may be deeper than the LUMO energy level of the zinc oxide layer or the metal-doped zinc oxide layer. For example, a HOMO energy level of the electron auxiliary layer 14 may be different from a HOMO energy level of the zinc oxide layer or the metal-doped zinc oxide layer, and for example the HOMO energy level of the electron auxiliary layer 14 may be deeper than the HOMO energy level of the zinc oxide layer or the metal-doped zinc oxide layer.

An energy level difference between the quantum dot layer 13 and the electron auxiliary layer 14 may change depending on an energy level change of the electron auxiliary layer 14. For example, a difference between LUMO energy levels of the quantum dot layer 13 and the electron auxiliary layer 14 may be greater than a difference between LUMO energy levels of the quantum dot layer 13 and the zinc oxide layer or the metal-doped zinc oxide layer.

For example, a difference between LUMO energy levels of the quantum dot layer 13 and the electron auxiliary layer 14 may be greater than a difference between LUMO energy levels of the quantum dot layer 13 and the zinc oxide layer or the metal-doped zinc oxide layer by for example about 0.1 eV to about 1.2 eV, about 0.2 eV to about 1.1 eV, or about 0.3 eV to about 1.1 eV.

For example, a difference between LUMO energy levels of the quantum dot layer 13 and the electron auxiliary layer 14 may be about 1.0 eV to about 2.0 eV, for example about 1.1 eV to about 1.8 eV, or about 1.1 eV to about 1.7 eV.

For example, the LUMO energy level of the quantum dot layer 13 may be about 2.5 eV to about 3.6 eV and the LUMO energy level of the electron auxiliary layer 14 may be about 3.7 eV to about 5.3 eV.

The quantum dot device 10 may further include additional layers between each layer.

The hole auxiliary layer 12, the quantum dot layer 13, and the electron auxiliary layer 14 may be for example formed with a solution process, for example a spin coating, a slit coating, inkjet printing, a nozzle printing, spraying a doctor blade coating, or a combination thereof, but is not limited thereto.

For example, the electron auxiliary layer 14 may be manufactured by mixing a Zn salt and optionally an M salt (wherein M is the same as described above) in a first solvent to prepare a first solution, preparing a second solution including a nanoparticle represented by $Zn_{1-x}M_xO$ ($0 \leq x < 0.5$) through a sol-gel reaction of the first solution, dissolving a metal halide represented by $Q^+X^-$ (Q and X are the same as described above) in a second solvent to prepare a third solution, preparing a mixed solution of the second solution and the third solution, and coating the mixed solution on the quantum dot layer 13. A doping amount of the metal-doped nanoparticle may be adjusted by controlling a supply ratio of the Zn salt and the M salt. Herein the metal halide may be supplied so that it may be included in an amount of about 3 to about 20 parts by weight, based on 100 parts by weight of the nanoparticle. Herein, the first solvent and the second solvent may be the same or different and may be for example an alcohol, for example methanol, ethanol, isopropanol, butanol, or a mixed solvent thereof.

The quantum dot device may be for example applied to various electronic devices such as display devices or lighting devices, and the like.

Hereinafter, the embodiments are illustrated in more detail with reference to examples. However, these examples are exemplary, and the present disclosure is not limited thereto.

Synthesis Example: Synthesis of Quantum Dot

1. Synthesis of ZnTeSe Core

Selenium (Se) and tellurium (Te) are dispersed in trioctylphosphine (TOP) to obtain a 2 molar (M) Se/TOP stock solution and a 0.1 M Te/TOP stock solution. 0.125 millimoles (mmol) of zinc acetate, 0.25 mmol of oleic acid, and 0.25 mmol of hexadecylamine are put along with 10 milliliters (mL) of trioctylamine in a reactor and then, heated at 120° C. under vacuum. After 1 hour, an atmosphere in the reactor is converted into nitrogen.

After heating the reactor at 300° C., the Se/TOP stock solution and the Te/TOP stock solution are rapidly added thereto in a Te/Se ratio of 1/25. After 10 minutes, 30 minutes, or 60 minutes, the reaction solution is rapidly cooled down to room temperature, acetone is added thereto, and a precipitate obtained by centrifuging the mixture is dispersed in toluene to obtain a ZnTeSe quantum dot.

2. Synthesis of ZnTeSe Core/ZnSeS Shell Quantum Dot 1.8 mmol (0.336 grams (g)) of zinc acetate, 3.6 mmol (1.134 g) of oleic acid, and 10 mL of trioctylamine are put into a flask and vacuumed at 120° C. for 10 minutes. The inside of flask is substituted with nitrogen ($N_2$) and heated at 180° C. The ZnTeSe core obtained in Synthesis Example 1 is put therein within 10 seconds, subsequently, 0.04 mmol of Se/TOP is slowly injected and then heated at 280° C. Then, 0.01 mmol of S/TOP is put thereto and heated at 320° C. and reacted for 10 minutes. Continuously, a mixed solution of 0.02 mmol of Se/TOP and 0.04 mmol of S/TOP is slowly injected and reacted again for 20 minutes. Then, the step of injecting Se and S by changing the mixing ratio thereof and reacting the same for 20 minutes is repeated. The mixed solution of Se and S uses a mixed solution of 0.01 mmol Se/TOP+0.05 mmol S/TOP, a mixed solution (B) of 0.005 mmol Se/TOP+0.1 mmol S/TOP, and a solution of 0.5 mmol S/TOP, sequentially.

After completing all the reaction, the reactor is cooled, the prepared nanocrystal is precipitated with ethanol, and the obtained nanocrystal is centrifuged with ethanol and dispersed in toluene to obtain a ZnTeSe/ZnSeS core/shell quantum dot.

Preparation Example: Preparation of Solution for Hole Auxiliary Layer

Preparation Example 1

9.00 mmol of zinc acetate dihydrate and 90 mL of dimethyl sulfoxide are put into a reactor and heated under air at 60° C. Subsequently, 15 mmol of tetramethylammonium hydroxide pentahydrate is dissolved in 30 mL of ethanol and the solution is put into the reactor at 3 mL per one minute in a dropwise fashion. After stirring the mixture for 1 hour, the prepared ZnO nanoparticle and ethyl acetate are centrifuged in a volume ratio of 1:9 and dispersed in ethanol to obtain a solution in which the ZnO nanoparticle is dispersed.

Subsequently, a solution prepared by dissolving NaCl (a concentration: 5 to 20 milligrams per milliliter (mg/mL)) in methanol is mixed with the solution in which the ZnO nanoparticle is dispersed (a concentration: 30 to 100 mg/mL) to prepare a solution for a hole auxiliary layer.

Herein, NaCl is supplied in an amount of 5 parts by weight, based on 100 parts by weight of the ZnO nanoparticle.

Preparation Example 2

A solution for a hole auxiliary layer is prepared according to the same method as Preparation Example 1 except for supplying NaCl in an amount of 10 parts by weight, based on 100 parts by weight of the ZnO nanoparticle.

Comparative Preparation Example 1

A solution for a hole auxiliary layer is prepared according to the same method as Preparation Example 1 except for not supplying NaCl.

Preparation Example 3

8.07 mmol of zinc acetate dihydrate, 0.93 mmol of magnesium acetate tetrahydrate, and 90 mL of dimethylsulfoxide are put into a reactor and heated under air at 60° C. Subsequently, 15 mmol of tetramethylammonium hydroxide pentahydrate is dissolved in 30 mL of ethanol and the solution is put into the reactor at 3 mL per one minute in a dropwise fashion. After stirring the mixture for 1 hour, the prepared $Zn_{0.85}Mg_{0.15}O$ nanoparticle and ethyl acetate are centrifuged in a volume ratio of 1:9 and dispersed in ethanol to obtain a solution in which the $Zn_{0.85}Mg_{0.15}O$ nanoparticle is dispersed.

Subsequently, a solution prepared by dissolving NaCl (a concentration: 5 to 20 mg/mL) in methanol is mixed with the solution in which the $Zn_{0.85}Mg_{0.15}O$ nanoparticle (a concentration: 30 to 100 mg/mL) is dispersed to prepare a solution for a hole auxiliary layer. Herein, NaCl is supplied in an amount of 5 parts by weight, based on 100 parts by weight of the $Zn_{0.85}Mg_{0.15}O$ nanoparticle.

Preparation Example 4

A solution for a hole auxiliary layer is prepared according to the same method as Preparation Example 1 except for supplying NaCl in an amount of 10 parts by weight, based on 100 parts by weight of the $Zn_{0.85}Mg_{0.15}O$ nanoparticle.

Comparative Preparation Example 2

A solution for a hole auxiliary layer is prepared according to the same method as Preparation Example 3 except for not supplying NaCl.

Evaluation I

High temperature stability of the solutions of Preparation Examples 1 to 4 and Comparative Preparation Examples 1 and 2 is evaluated.

The high temperature stability is confirmed by formation of agglomerations after placing the solutions of Preparation Examples 1 to 4 and Comparative Preparation Examples 1 and 2 on a 60° C. hot plate for 2 hours.

Figure 2:
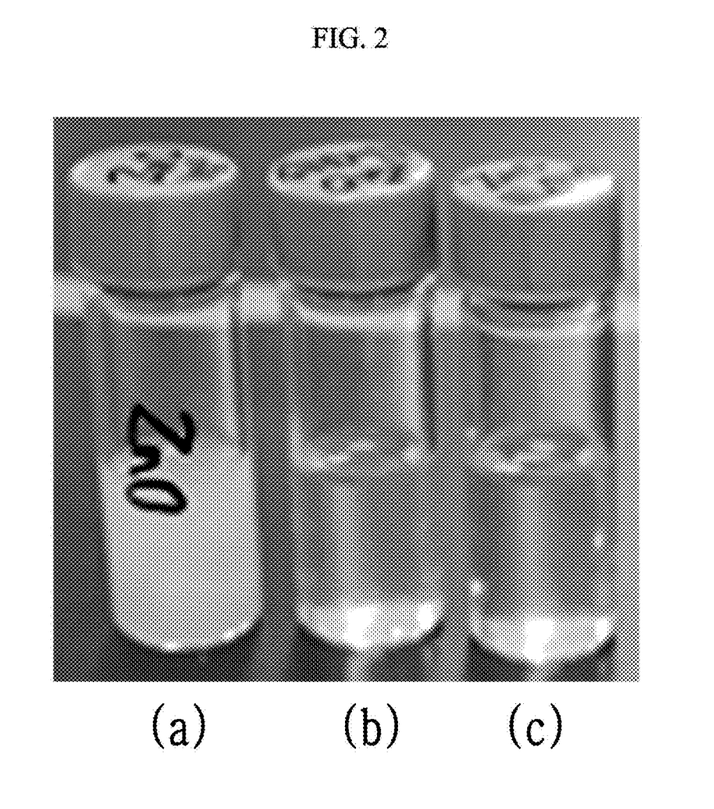
FIG. 2 is a photograph showing changes of the solutions of Preparation Examples 1 and 2 and Comparative Preparation Example 1 after being allowed to stand at a high temperature.

The results are shown in FIG. 2 and Table 1.

FIG. 2 is a photograph showing changes of the solutions of Preparation Examples 1 and 2 and Comparative Preparation Example 1 after being allowed to stand at a high temperature.

In FIG. 2, (a) is the solution according to Comparative Preparation Example 1, (b) is the solution of Preparation Example 1, and (c) is the solution of Preparation Example 2.

TABLE 1

| | |
|---|---|
| Preparation Example 1 | Transparent (agglomerate is not formed) |
| Preparation Example 2 | Transparent (agglomerate is not formed) |
| Comparative Preparation Example 1 | Cloudy (agglomerate is formed) |
| Preparation Example 3 | Transparent (agglomerate is not formed) |
| Preparation Example 4 | Transparent (agglomerate is not formed) |
| Comparative Preparation Example 2 | Cloudy (agglomerate is formed) |

Referring to Table 1, agglomerates in the solutions of Preparation Examples 1 to 4 are not formed even after the solutions are allowed to stand at a high temperature, but agglomerates in the solutions according to Comparative Preparation Examples 1 and 2 are formed after the solutions are allowed to stand at a high temperature. Accordingly, the solutions of Preparation Examples 1 to 4 show high temperature stability.

Evaluation II

The solutions of Preparation Example 2 and Comparative Preparation Example 1 are respectively spin-coated to be 40 nm thick on a glass plate and heat-treated at 80° C. for 30 minutes.

A surface morphology of the formed thin film is confirmed.

Figure 3:
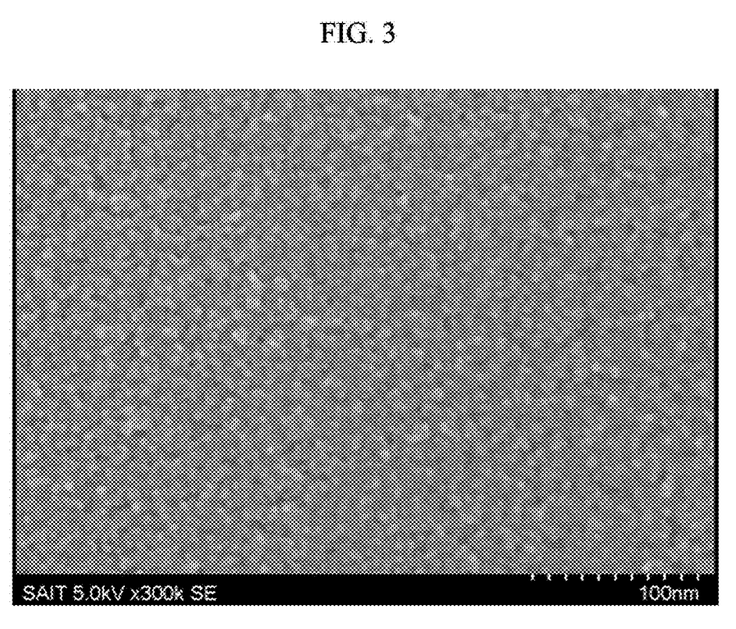
FIG. 3 is a scanning electron microscopy (SEM) photograph of a thin film formed of the solution of Preparation Example 2.
Figure 4:
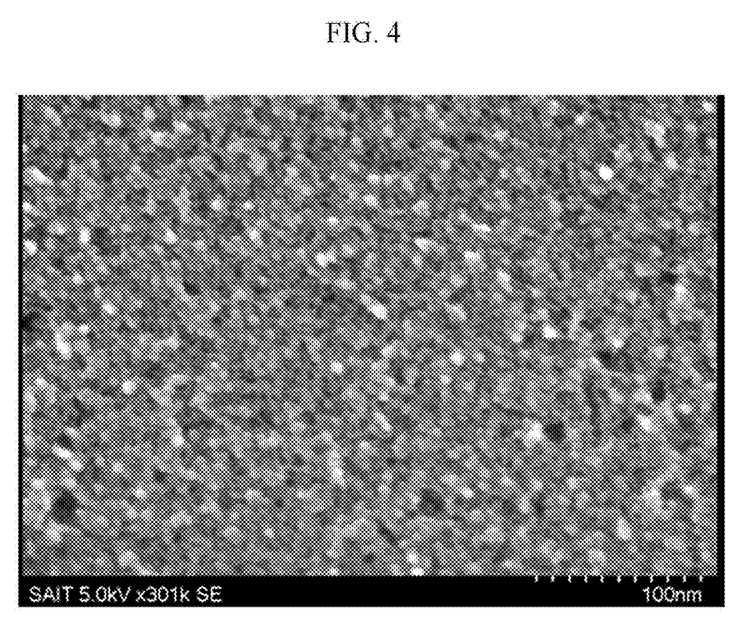
FIG. 4 is a SEM photograph of a thin film formed of the solution of Comparative Preparation Example 1.

FIG. 3 is a SEM photograph of a thin film formed of the solution of Preparation Example 2 and FIG. 4 is a SEM photograph of a thin film formed of the solution according to Comparative Preparation Example 1.

Referring to FIGS. 3 and 4, the thin film formed of the solution of Preparation Example 2 is denser than the solution according to Comparative Preparation Example 1 and thus shows improved surface morphology.

Manufacture of Quantum Dot Device

Example 1

A glass substrate deposited with ITO (work function (WF): 4.8 electron volts (eV)) is surface-treated with an UV-ozone for 15 minutes, spin-coated with a PEDOT:PSS solution (H.C. Starks Co., Ltd.), and heat-treated under the air atmosphere at 150° C. for 10 minutes and then, under an $N_2$ atmosphere at 150° C. for 10 minutes to form a 25 nm-thick hole injection layer (HOMO: 5.3 eV and LUMO: 2.7 eV). Subsequently, on the hole injection layer, a 25 nm-thick hole transport layer (HOMO: 5.6 eV and LUMO: 2.69 eV) is formed by spin-coating poly[(9,9-dioctylfluorenyl-2,7-diyl-co(4,4'-(N-4-butylphenyl)diphenylamine] solution (TFB) (Sumitomo) and heat-treating the same at 150° C. for 30 minutes. On the hole transport layer, a 25 nm-thick quantum dot layer (HOMO: 5.7 eV and LUMO: 2.97 eV) by spin-coating the ZnTeSe/ZnSeS core-shell quantum dot obtained in Synthesis Example and heat-treating the same at 80° C. for 30 minutes. On the quantum dot layer, a 40 nm-thick electron auxiliary layer (HOMO: 7.82 eV and LUMO: 4.30 eV) by spin-coating the solution obtained in Preparation Example 1 and heat-treating the same at 80° C. for 30 minutes. On the electron auxiliary layer, a second electrode (cathode) is formed by vacuum-depositing aluminum (Al) to be 90 nm to manufacture a quantum dot device.

Example 2

A quantum dot device is manufactured according to the same method as Example 1 except for forming an electron auxiliary layer (HOMO: 7.82 eV, LUMO: 4.30 eV) by using the solution of Preparation Example 2 instead of the solution of Preparation Example 1.

Example 3

A quantum dot device is manufactured according to the same method as Example 1 except for forming an electron auxiliary layer (HOMO: 8.81 eV, LUMO: 5.13 eV) by using the solution of Preparation Example 3 instead of the solution of Preparation Example 1.

Example 4

A quantum dot device is manufactured according to the same method as Example 1 except for forming an electron auxiliary layer (HOMO: 8.81 eV, LUMO: 5.13 eV) by using the solution of Preparation Example 4 instead of the solution of Preparation Example 1.

Comparative Example 1

A quantum dot device is manufactured according to the same method as Example 1 except for forming an electron auxiliary layer (HOMO: 7.54 eV, LUMO: 4.18 eV) by using the solution according to Comparative Preparation Example 1 instead of the solution of Preparation Example 1.

Comparative Example 2

A quantum dot device is manufactured according to the same method as Example 1 except for forming an electron auxiliary layer (HOMO: 8.42 eV, LUMO: 4.74 eV) by using the solution of Comparative Preparation Example 1 instead of the solution of Preparation Example 2.

Evaluation III

Current-voltage-luminescence characteristics of the quantum dot devices of Examples 1 to 4 and Comparative Examples 1 and 2 are evaluated.

The current-voltage-luminescence characteristics are evaluated by using a Keithley 220 current source and a Minolta CS200 spectroradiometer.

The results are shown in Tables 2 and 3.

TABLE 2

|  | Example 1 | Example 2 | Comparative Example 1 |
|---|---|---|---|
| $EQE_{max}$ | 7.4 | 5.8 | 5.8 |
| EQE @500 nit | 3.7 | 4.9 | 3.2 |
| V @ 5 mA | 2.8 | 2.8 | 2.9 |
| V @ 100 nit | 3.0 | 3.0 | 3.2 |
| $Lum_{max}$ | 10300 | 9220 | 6450 |
| T50 @500 nit (%) | 218 | 292 | 100 (ref.) |
| λmax | 632 | 634 | 636 |

TABLE 3

|  | Example 3 | Example 4 | Comparative Example 2 |
|---|---|---|---|
| $EQE_{max}$ | 9.6 | 12.3 | 6.6 |
| EQE @500 nit | 7.5 | 8.7 | 6.6 |
| V @ 5 mA | 3.0 | 3.0 | 2.9 |
| V @ 100 nit | 3.0 | 3.0 | 3.2 |
| $Lum_{max}$ | 21500 | 26020 | 16390 |
| T50 @500 nit (%) | 239 | 354 | 100 (ref.) |
| λmax | 632 | 632 | 633 |

$EQE_{max}$: maximum external quantum efficiency

TABLE 3-continued

|  | Example 3 | Example 4 | Comparative Example 2 |
|---|---|---|---|

EQE@500 nit: external quantum efficiency at 500 nit (candela per square meter ($cd/m^2$))
V @ 5 mA: voltage at 5 milliamperes (mA)
V @ 100 nit: voltage at 100 nit
$Lum_{max}$: maximum luminance
T50 @500 nit: time taken for luminance at a constant current of an initial 500 nit reference to decrease down to 50% (a relative value to 100% (ref) of Comparative Examples 1 and 2)

Referring to Table 2, the quantum dot devices of Examples 1 and 2 show improved efficiency and life-span compared with the quantum dot device according to Comparative Example 1.

Likewise, referring to Table 3, the quantum dot devices of Examples 3 and 4 show improved efficiency and life-span compared with the quantum dot device according to Comparative Example 2.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot device, comprising
an anode and a cathode facing each other,
a quantum dot layer between the anode and the cathode, and
an electron auxiliary layer between the quantum dot layer and the cathode,
wherein the electron auxiliary layer comprises at least one nanoparticle represented by Chemical Formula 1 and at least one metal halide represented by Chemical Formula 2:

$$Zn_{1-x}M_xO \qquad \text{Chemical Formula 1}$$

wherein, in Chemical Formula 1,
M is Mg, Co, Ni, Zr, Mn, Sn, Y, Al, or a combination thereof, and
0≤x<0.5, $$Q^+X^- \qquad \text{Chemical Formula 2}$$

wherein, in Chemical Formula 2,
Q is Zn, Na, K, Li, or a combination thereof, and
X is a halogen.

2. The quantum dot device of claim 1, wherein the metal halide is present between the nanoparticles.

3. The quantum dot device of claim 1, wherein the nanoparticle is passivated by the metal halide.

4. The quantum dot device of claim 1, wherein the metal halide is bound to a surface of the nanoparticle.

5. The quantum dot device of claim 1, wherein the nanoparticle has an average particle diameter of less than or equal to about 10 nanometers.

6. The quantum dot device of claim 1, wherein the metal halide is present in an amount of about 3 to about 20 parts by weight relative to 100 parts by weight of the nanoparticle.

7. The quantum dot device of claim 1, wherein the nanoparticle comprises a ligand bound to a surface of the nanoparticle.

8. The quantum dot device of claim 7, wherein the ligand comprises an acetate, a carboxylate, a cyano group, an amine, an amide, a nitride, a nitrate, a sulfonyl, or a combination thereof.

9. The quantum dot device of claim 7, wherein the metal halide is bound to the ligand.

10. The quantum dot device of claim 1, wherein a difference between lowest unoccupied molecular orbital energy levels of the quantum dot layer and the electron auxiliary layer is greater than a difference between lowest unoccupied molecular orbital energy levels of the quantum dot layer and a layer comprising the nanoparticle.

11. The quantum dot device of claim 10, wherein
a lowest unoccupied molecular orbital energy level of the quantum dot layer ranges from about 2.5 electron volts to about 3.6 electron volts and
a lowest unoccupied molecular orbital energy level of the electron auxiliary layer ranges from about 3.7 electron volts to about 5.3 electron volts.

12. The quantum dot device of claim 1, wherein the nanoparticle and the metal halide are present as a mixture.

13. The quantum dot device of claim 1, wherein the quantum dot layer comprises a non-cadmium quantum dot.

14. The quantum dot device of claim 13, wherein
the quantum dot comprises
zinc and tellurium, selenium, or a combination thereof, or
indium (In) and zinc, phosphorus, or a combination thereof.

15. The quantum dot device of claim 14, wherein
the quantum dot comprises a core comprising
zinc and tellurium, selenium, or a combination thereof
or
indium and zinc, phosphorus, or a combination thereof
and
a shell on at least a part of the core, the shell having a different composition from the core.

16. The quantum dot device of claim 15, wherein the shell comprises ZnSeS, ZnS, or a combination thereof.

17. A method of manufacturing a quantum dot device, comprising
forming an anode,
forming a quantum dot layer on the anode,
forming an electron auxiliary layer on the quantum dot layer, and
forming a cathode on the electron auxiliary layer,
wherein the forming of the electron auxiliary layer comprises
mixing a Zn precursor and optionally a precursor comprising M, wherein M is Mg, Co, Ni, Zr, Mn, Sn, Y, Al, or a combination thereof, in a first solvent to prepare a first solution,
preparing a second solution comprising a nanoparticle represented by $Zn_{1-x}M_xO$, wherein $0 \leq x < 0.5$, through a sol-gel reaction of the first solution,
dissolving a metal halide represented by $Q^+X^-$, wherein Q is Zn, Na, K, Li, or a combination thereof and X is a halogen, in a second solvent to prepare a third solution,
preparing a mixed solution of the second solution and the third solution, and
coating the mixed solution on the quantum dot layer to manufacture the quantum dot device.

18. The method of claim 17, wherein the first solvent and the second solvent comprise the same or different alcohols.

19. The method of claim 17, wherein the metal halide in the mixed solution is present in an amount of about 3 to about 20 parts by weight relative to 100 parts by weight of the nanoparticle.

20. A display device comprising the quantum dot device of claim 1.

* * * * *